March 14, 1967 W. W. LANCASTER ET AL 3,309,617

CONTROLLABLE GAIN TRANSISTOR AMPLIFIER UTILIZING
CURRENT-VARIABLE IMPEDANCE IN EMITTER CIRCUIT
FOR PROVIDING CONTROLLABLE
SIGNAL DEGENERATION

Filed May 4, 1964

INVENTORS
ABRAM HOPENGARTEN
WILLIAM W. LANCASTER
BY
Robert D. Sanborn
ATTORNEY 3,309,617
Patented Mar. 14, 1967

3,309,617

CONTROLLABLE GAIN TRANSISTOR AMPLIFIER UTILIZING CURRENT-VARIABLE IMPEDANCE IN EMITTER CIRCUIT FOR PROVIDING CONTROLLABLE SIGNAL DEGENERATION

William W. Lancaster, Philadelphia, and Abram Hopengarten, Lafayette Hills, Pa., assignors to Philco-Ford Corporation, a corporation of Delaware Filed May 4, 1964, Ser. No. 364,635
4 Claims. (Cl. 330—28)

This invention relates to means for controlling the gain of transistor amplifiers. The invention is applicable, for example, to automatic gain control in a transistorized radio receiver.

Prior arrangements for controlling the gain of transistor amplifiers have not been entirely satisfactory mainly because they tend to limit the signal handling capabilities of the transistor amplifier.

The principal object of the present invention is to overcome this objection and to provide an arrangement whereby the gain of a transistor amplifier may be controlled and at the same time its signal handling capability may be increased.

SUMMARY

In accordance with this invention, the gain of a transistor amplifier is varied by means of a controlled degeneration arrangement in the emitter circuit. More particularly, there is provided in the emitter circuit an arrangement comprising in parallel a fixed impedance element and an impedance element whose impedance varies with change of current therethrough. The input signal is applied across the series combination of the transistor's base-emitter diode and the emitter circuit impedance. AGC voltage is applied to the base of the transistor. At maximum gain, represented by minimum AGC voltage at the base, the effective impedance in the emitter circuit is low. As the AGC voltage is increased, the transistor current is decreased and the effective impedance in the emitter circuit is increased. The consequent degenerative action decreases the amplifier gain and at the same time enables the amplifier to handle large signals without distortion.

Figure 1:
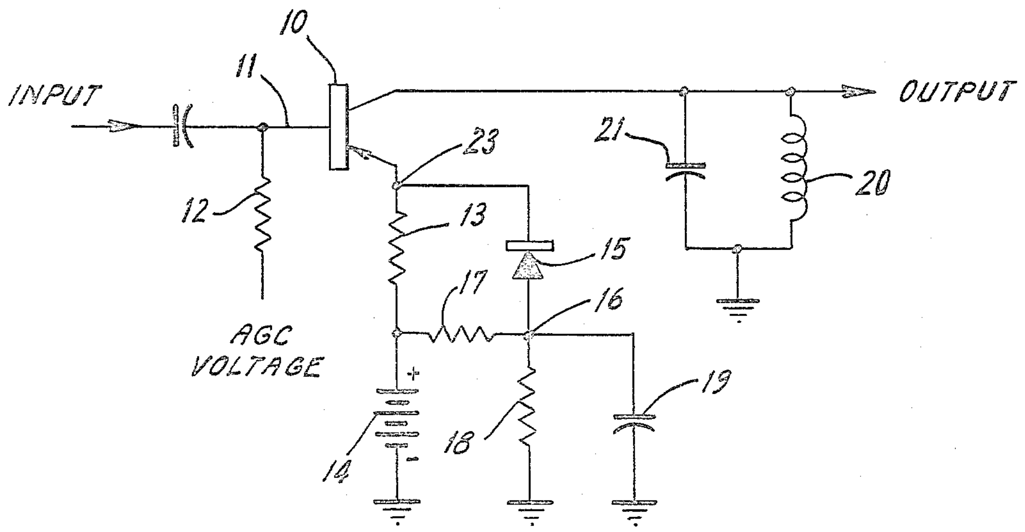
Figure 2:
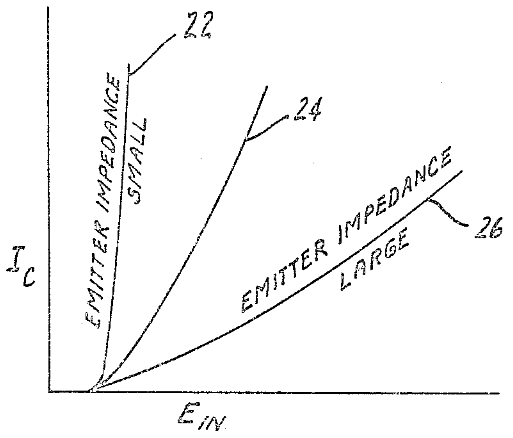

Drawings:

FIG. 1 is a schematic illustration of a variable gain amplifier according to a preferred embodiment of the invention; and FIG. 2 illustrates generally the operating characteristic of the amplifier.

Referring more particularly to FIG. 1 of the drawing, there is shown a variable gain amplifier comprising a transistor 10 having a base, an emitter, and a collector. By way of example, the transistor is shown as being of the p-n-p type but of course it could be of the n-p-n type with appropriate changes of polarities of circuit elements. The input circuit 11 is connected to the base for application of an input signal thereto. An AGC voltage is applied to the base through the AGC connection including resistor 12.

In the emitter circuit there is provided a gain control arrangement according to this invention. This comprises a fixed impedance element in the form of a resistor 13 connected between the emitter and a source of emitter bias potential 14, and an impedance element, e.g. a diode 15, whose impedance varies with change of current therethrough. Diode 15 is biased for conduction by virtue of its being connected between the emitter and a tap 16 on a voltage divider comprising resistors 17 and 18 connected across the voltage source 14. A signal by-pass capacitor 19 is connected in shunt with resistor 18.

The collector circuit includes a load which may comprise an inductor 10 and a capacitor 21 connected in parallel between the collector and ground. The output signal may be derived from across the load as shown.

By virtue of the emitter circuit arrangement, provided by this invention, including the diode 15 shunted by resistor 13, the operating characteristic of the amplifier is of the nature illustrated generally in FIG. 2. When the input signal is weak, the AGC voltage at the base of the transistor is a minimum and the amplifier operates with high gain on a characteristic represented by line 22. The current through diode 15 is then a maximum and its impedance is low. Hence it shunts resistor 13. With low effective impedance in the emitter circuit, the gain is high as represented by the steep slope of line 22.

When the input signal increases, the AGC voltage is increased and the transistor current is decreased. As the current decreases the emitter voltage at point 23 rises. Consequently the impedance of the diode increases and it becomes less effective as a by-pass, and more of the total current flows through resistor 13. The consequent increased degenerative effect of resistor 13 decreases the gain of the amplifier. For an input signal of moderate amplitude the operating characteristic of the amplifier may be as represented by line 24. For large amplitude input signals the potential at point 23 becomes higher than the voltage at point 16 and the diode 15 is cut off. The amplifier then operates with low gain on a characteristic represented by line 26.

Thus by the arrangement provided by this invention the effective emitter circuit impedance is caused to be low for weak signals and high for strong signals, and the degenerative action on strong signals enables the amplifier to handle larger signals without distortion.

While a diode is employed in the embodiment shown, it will be apparent that any equivalent element whose impedance is inversely proportional to current therethrough, such as a variable resistor (varistor) of the type sold under the tradename "Thyrite," could be substituted for diode 15.

In one physical embodiment of the invention as applied to automatic gain control of an RF amplifier in a transistor radio receiver, resistors 12 and 18 each has a value of 820 ohms, and resistors 13 and 17 have values of 12 kilohms and 1 kilohm, respectively. The AGC voltage is derived from the emitter of a succeeding IF stage.

While the invention has been described with reference to the illustrated embodiment, it will be understood that the invention is not limited thereto but contemplates such modifications and further embodiments as may occur to those skilled in the art.

We claim:

1. A variable gain amplifier for alternating current signals, comprising: a transistor having a base, an emitter, and a collector, a signal input circuit connected to said base, means for applying a gain control voltage to said base, an emitter circuit, means in said emitter circuit for causing said amplifier to produce degeneration of alternating current signals applied to said input circuit, said means including in parallel a fixed impedance element and a diode, means for biasing said diode such that (1) when said gain control voltage is relatively low, said diode will be forward-biased and thereby bypass said fixed impedance element with the comparatively low forward-biased impedance of said diode so as to provide a relatively high gain amplifier, and (2) when said gain control voltage is relatively high, said diode will be reverse biased, thereby unbypassing said fixed impedance element so as to provide a relatively high emitter degeneration impedance and hence a relatively low gain amplifier, a collector circuit, and means for deriving an output signal from said collector circuit.

2. A variable gain amplifier for alternating current signals, comprising: a transistor having a base, an emitter, and a collector, a signal input circuit connected to said base, means for applying an automatic gain control voltage to said base, an emitter circuit, means in said emitter circuit for causing said amplifier to produce degeneration of alternating current signals applied to said input circuit, said means including in parallel a resistor and a diode, means for biasing said diode to render it conductive when said automatic gain control voltage is of low value and reverse biased when said automatic gain control voltage is of high value, a collector circuit, and means for deriving an output signal from said collector circuit.

3. A variable gain amplifier for alternating current signals, comprising: a transistor having a base, an emitter, and a collector, a signal input circuit connected to said base, means for applying an automatic gain control voltage to said base, a resistor having one end connected to said emitter, a D.C. voltage source connected to the other end of said resistor, a voltage divider connected across said source, a diode connected to said emitter and to said divider such that (1) when said gain control voltage is relatively low, said diode will be forward biased and thereby bypass said resistor with the comparatively low forward-biased impedance of said diode so as to provide a relatively high gain amplifier, and (2) when said gain control voltage is relatively high, said diode will be reverse biased, thereby unbypassing said resistor so as to provide a relatively high emitter degeneration impedance and hence a relatively low gain amplifier, said resistor and said diode being the only elements directly connected to said emitter, a collector circuit, and means for deriving an output signal from said collector circuit.

4. A variable gain amplifier for alternating current signals, comprising: a PNP transistor having a base, an emitter, and a collector, a signal input circuit connected to said base, means for applying an automatic gain control voltage to said base, a resistor having one end connected to said emitter, a source of positive D.C. voltage connected to the other end of said resistor, a voltage divider connected across said source, a diode having its negative terminal connected to said emitter and having its positive terminal connected to said divider such that (1) when said gain control voltage is relatively low, said diode will be forward biased and thereby bypass said resistor with the comparatively low forward-biased impedance of said diode so as to provide a relatively high gain amplifier, and (2) when said gain control voltage is relatively high, said diode will be reverse biased, thereby unbypassing said resistor so as to provide a relatively high emitter degeneration impedance and hence a relatively low gain amplifier, said resistor and said diode being the only elements directly connected to said emitter, a collector circuit, and means for deriving an output signal from said collecter circuit.

References Cited by the Examiner

UNITED STATES PATENTS

| | | | |
|---|---|---|---|
| 2,897,353 | 7/1959 | Schweiss. | |
| 3,014,186 | 12/1961 | Webster | 330—29 X |
| 3,019,396 | 1/1962 | Heine et al. | 330—28 |
| 3,143,711 | 8/1964 | Read | 330—29 X |

FOREIGN PATENTS

| | | |
|---|---|---|
| 229,059 | 7/1959 | Australia. |
| 1,121,136 | 1/1962 | Germany. |

OTHER REFERENCES

"Transistor Circuitry in Japan," Electronics, July 1956, pp. 120–123.

ROY LAKE, *Primary Examiner.*

J. B. MULLINS, R. P. KANANEN, *Assistant Examiners.*